(12) United States Patent
Takagi

(10) Patent No.: US 7,706,422 B2
(45) Date of Patent: Apr. 27, 2010

(54) SEMICONDUCTOR OPTICAL ELEMENT

(75) Inventor: Kazuhisa Takagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 125 days.

(21) Appl. No.: 11/626,507

(22) Filed: Jan. 24, 2007

(65) Prior Publication Data
US 2008/0084906 A1  Apr. 10, 2008

(30) Foreign Application Priority Data
Oct. 10, 2006  (JP)  ............................. 2006-276837

(51) Int. Cl.
H01S 5/00 (2006.01)

(52) U.S. Cl. ................. 372/44.01; 372/43.01

(58) Field of Classification Search .............. 372/44.01, 372/43.01
See application file for complete search history.

(56) References Cited

U.S. PATENT DOCUMENTS 5,012,484 A * 4/1991 Flynn et al. ................... 372/96
6,600,169 B2 * 7/2003 Stintz et al. ................... 257/14
6,999,485 B2 * 2/2006 Takagi ...................... 372/29.02
2003/0189964 A1 * 10/2003 Takagi ........................ 372/96

FOREIGN PATENT DOCUMENTS

| JP | 11-307860 | 11/1999 |
| JP | 2003-304035 | 10/2003 |
| JP | 2006196805 A * | 7/2006 |

OTHER PUBLICATIONS

Tatebayashi et al., "Lasing at 1.28 µm of InAs-GaAs Quantum Dots with AlGaAs Cladding Layer Grown by Metal-Organic Chemical Vapor Deposition" IEEE Journal of Selected Topics in Quantum Electronics, vol. 11, No. 5, Sep./Oct. 2005, pp. 1027-1034.
Phillips et al., "Self-Assembled InAs-GaAs Quantum-Dot Intersubband Detectors" IEEE Journal of Quantum Electronics, vol. 35, No. 6, Jun. 1999, pp. 936-943.

* cited by examiner

*Primary Examiner*—Minsun Harvey
*Assistant Examiner*—Kinam Park
(74) *Attorney, Agent, or Firm*—Leydig, Voit & Mayer, Ltd.

(57) ABSTRACT

A semiconductor optical element has an active layer including quantum dots. The density of quantum dots in the resonator direction in a portion of the active layer in which the density of photons is relatively high is increased relative to the density of quantum dots in a portion of the active layer in which the density of photons is relatively low.

2 Claims, 9 Drawing Sheets incidence end surface    emission end surface incidence end surface    emission end surface incidence end surface    emission end surface incidence end surface    emission end surface incidence end surface    emission end surface incidence end surface    emission end surface incidence end surface    emission end surface

SEMICONDUCTOR OPTICAL ELEMENT

BACKGROUND OF THE INVENTION

1. Field of the Invention

The present invention relates to a semiconductor optical element used as a light source for optical fiber communication or optical disk recording and a method of manufacturing the same.

2. Background Art

A semiconductor laser having quantum dots formed in its active layer (see, for example, IEEE JOURNAL SELECTED TOPICS IN QUANTUM ELECTRONICS, VOL. 11, No. 5, SEPTEMBER/OCTOBER 2005, pp 1027-1034) and a waveguide-type light receiving element having quantum dots formed in its absorption layer (see, for example, IEEE JOURNAL OF QUANTUM ELECTRONICS, VOL. 35, No. 6, JUNE 1999, pp 936-943) has been proposed. A semiconductor laser in which the density of quantum dots in its active layer is varied in a plane perpendicular to the resonator direction (light travel direction) has also been proposed (see, for example, Japanese Patent Laid-Open No. 11-307860).

SUMMARY OF THE INVENTION

The distribution of the density of photons in the active layer of a semiconductor laser is such that, as shown in FIG. 17, the density of photons is maximized in the vicinity of a phase shift region of a diffraction grating. That is, the semiconductor laser has a photon density distribution not uniform in the resonator direction in the active layer. On the other hand, the density of quantum dots in the conventional semiconductor laser is constant in the resonator direction in the active layer, as shown in FIG. 18.

Therefore, electrons and hole carriers in the active layer are reduced by hole burning in a portion of the active layer in which the photon density is high to cause a local reduction in gain. There is a problem that the emission efficiency of the semiconductor laser is reduced by such a local reduction in gain.

In view of the above-described problem, an object of the present invention is to provide a semiconductor optical element in which the local reduction in gain due to hole burning is reduced to improve the emission efficiency, and a method of manufacturing the semiconductor optical element.

According to one aspect of the present invention, a semiconductor optical element has an active layer including quantum dots, wherein the density of the quantum dots in a resonator direction in a portion of the active layer in which the density of photons is relatively high is increased relative to the density of the quantum dots in a portion of the active layer in which the density of photons is relatively low.

The present invention ensures that the local reduction in gain due to hole burning can be reduced to improve the emission efficiency.

Other and further objects, features and advantages of the invention will appear more fully from the following description.

DETAILED DESCRIPTION OF THE PREFERRED EMBODIMENTS

First Embodiment

Figure 1:
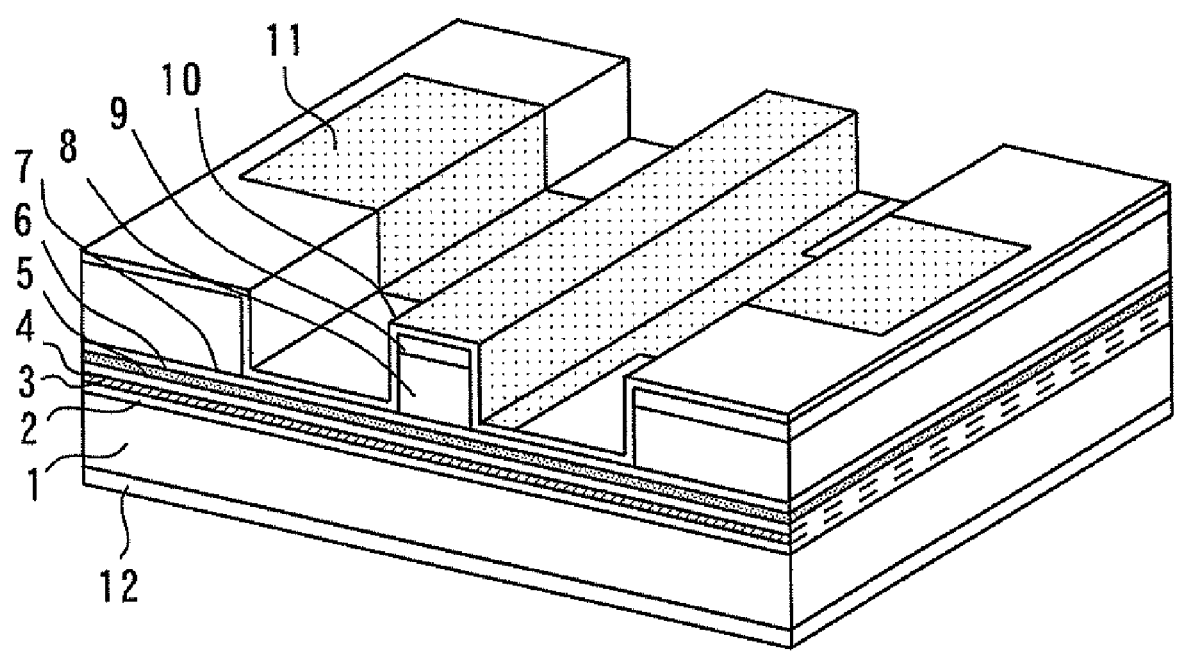
FIG. 1 is a perspective view of a semiconductor optical element according to a first embodiment of the present invention.
Figure 2:
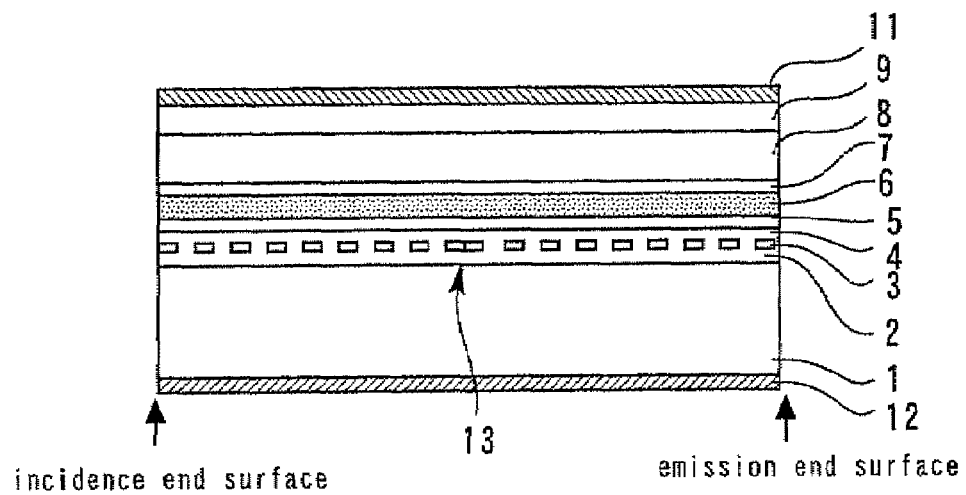
FIG. 2 is a sectional view in the resonator direction of the semiconductor optical element according to the first embodiment of the present invention.

FIG. 1 is a perspective view showing a semiconductor optical element according to a first embodiment of the present invention. FIG. 2 is a sectional view of the semiconductor optical element shown in FIG. 1, taken along a resonator direction. The semiconductor optical element in this embodiment is a ridge-type distributed feedback laser having an active layer including quantum dots, and a diffraction grating in a resonator.

As illustrated, on an n-GaAs substrate 1 are successively formed an n-GaAs cladding layer 2, an n-AlGaAs diffraction grating 3, an n-GaAs diffraction grating buried layer 4, an AlGaAs optical confinement layer 5, an active layer 6 having InAs quantum dots in AlGaAs, a p-GaAs cladding layer 7, a p-GaAs cladding layer 8, and a p-GaAs contact layer 9. A ridge is formed of the p-GaAs cladding layer 8 and the p-GaAs contact layer 9, The upper surface of the p-GaAs contact layer 9 and the ridge inner walls are covered with $SiO_2$ insulating film 10. A Ti/Pt/Au electrode (p-side electrode) 11 is formed so as to be connected to the p-GaAs contact layer 9 through an opening in the $SiO_2$ insulating film 10. A Ti/Pt/Au electrode (n-side electrode) 12 is formed on the back surface of the n-GaAs substrate 1.

Figure 3:
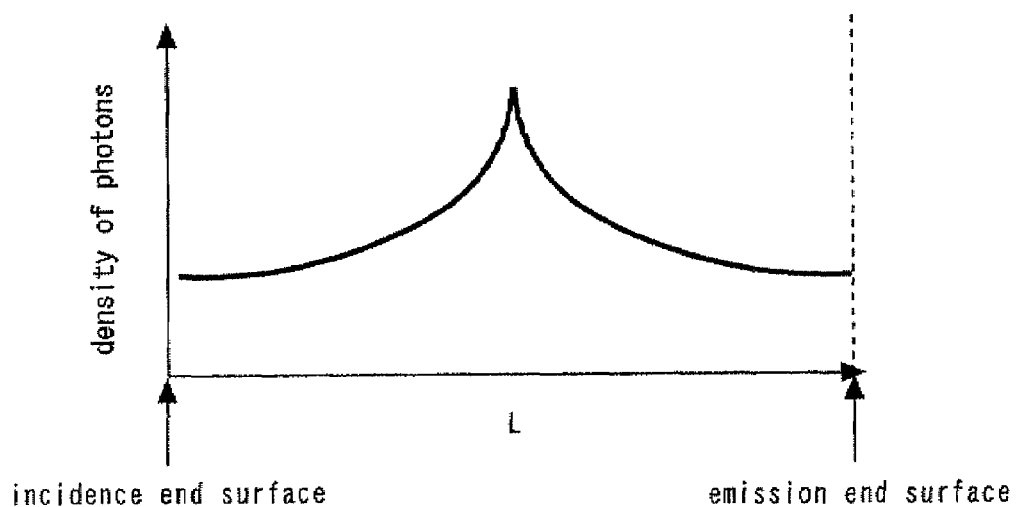
FIG. 3 is a graph showing the distribution of the density of photons in the resonator direction in the active layer of the semiconductor optical element according to the first embodiment of the present invention.
Figure 4:
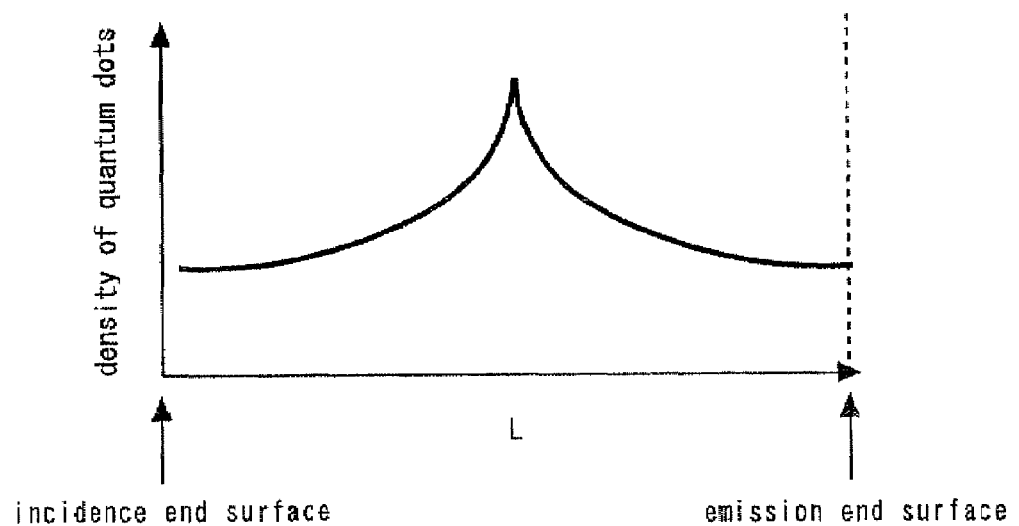
FIG. 4 is a graph showing the distribution of the density of quantum dots in the resonator direction in the active layer of the semiconductor optical element according to the first embodiment of the present invention.

FIG. 3 is a diagram showing the distribution of the density of photons in the resonator direction in the active layer of the semiconductor optical element according to the first embodiment of the present invention. As shown in FIG. 3, the density of photons is high in the vicinity of a phase shift region 13. Then, the density of quantum dots is relatively increased in the vicinity of the phase shift region 13 of the n-AlGaAs diffraction grating 3, as shown in FIG. 4. That is, the density of quantum dots in the resonator direction in a portion of the active layer in which the density of photons is relatively high is increased relative to the density of quantum dots in a portion of the active layer in which the density of photons is relatively low.

Thus, the density of quantum dots capable generating a gain is increased in a portion in which the density of photons is high, thereby limiting the reduction in carrier density caused per one quantum dot in comparison with the conventional art. The local reduction in gain due to hole burning is thereby reduced to improve the emission efficiency of the semiconductor layer.

Second Embodiment

Figure 5:
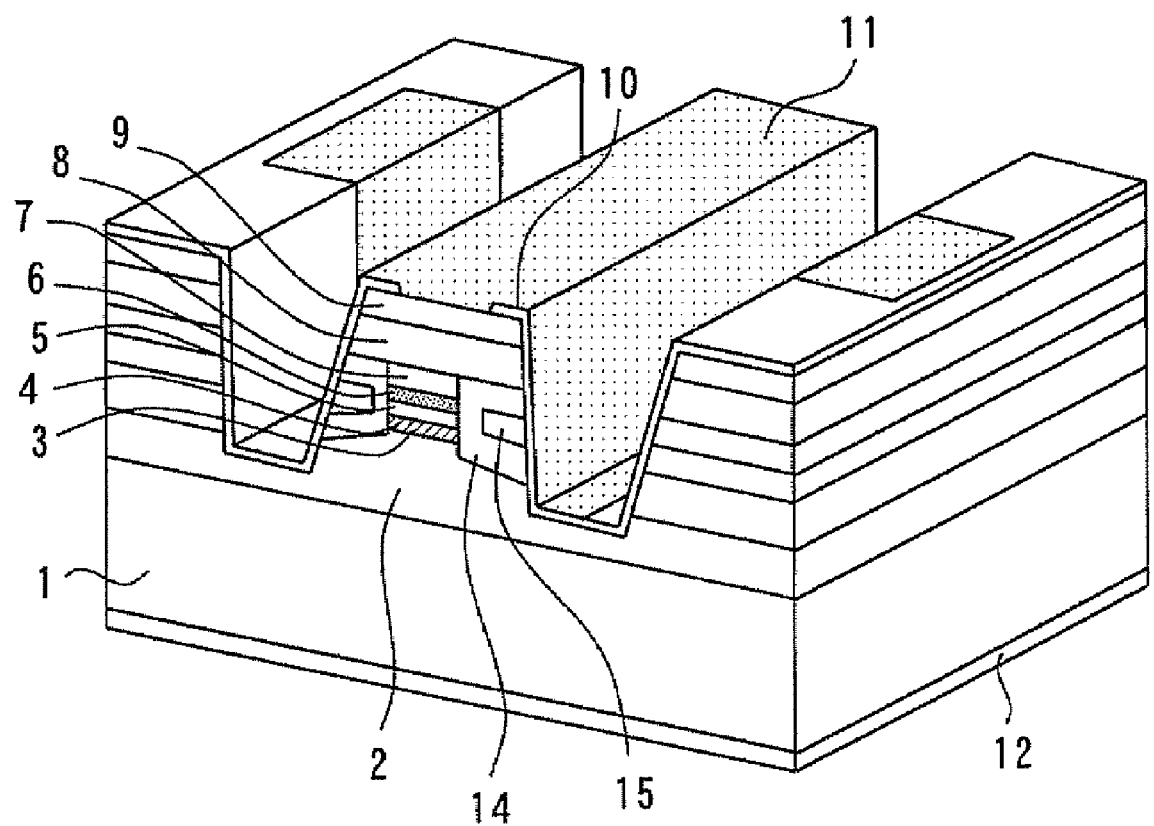
FIG. 5 is a perspective view of a semiconductor optical element according to a second embodiment of the present invention.

FIG. 5 is a perspective view showing a semiconductor optical element according to a second embodiment of the present invention. The same components as those shown in FIG. 1 are indicated by the same reference numerals, and the description for them will not be repeated. This semiconductor optical element is a buried hetero-type distributed feedback laser having an active layer including quantum dots and a diffraction grating in a resonator.

As illustrated, a p-GaAs current blocking layer 14 and an n-GaAs current blocking layer 15 are formed on opposite sides of the n-AlGaAs diffraction grating 3, the n-GaAs diffraction grating buried layer 4, the AlGaAs optical confinement layer 5, the active layer 6, and the p-GaAs cladding layer 7. In other respects, the construction is the same as that in the first embodiment. The same effect as that of the first embodiment is achieved in this way.

Third Embodiment

A semiconductor optical element according to a third embodiment of the present invention is a Fabry-Perot type semiconductor laser having an active layer including quantum dots, such as that in the first embodiment.

Figure 6:
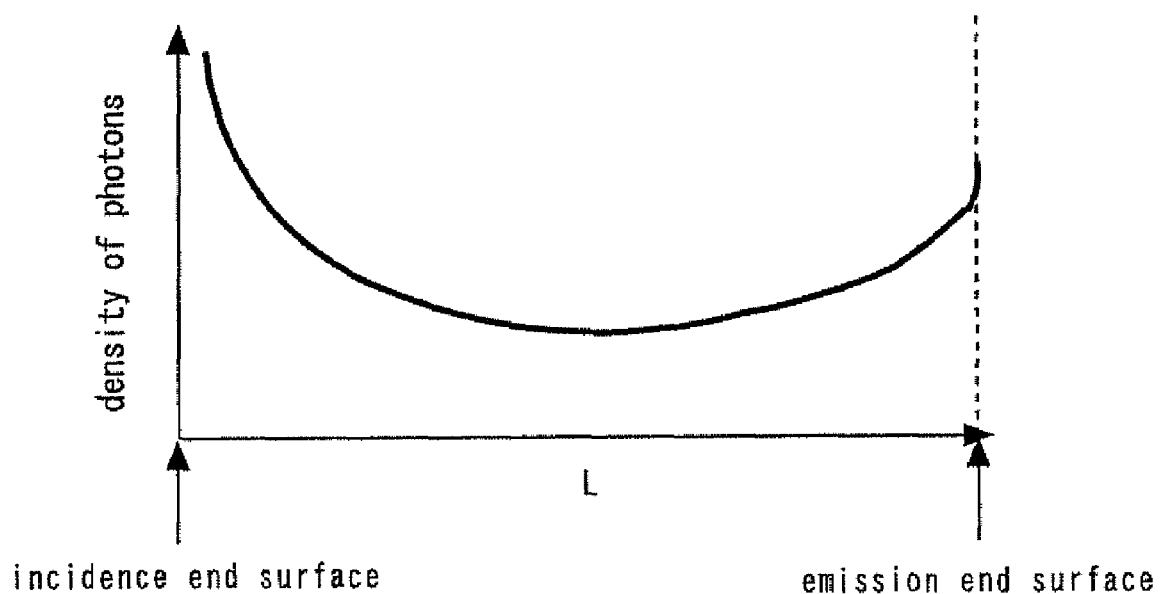
FIG. 6 is a graph showing the distribution of the density of photons in the resonator direction in the active layer of a semiconductor optical element according to a third embodiment of the present invention.
Figure 7:
FIG. 7 is a graph showing the distribution of the density of quantum dots in the resonator direction in the active layer of the semiconductor optical element according to the third embodiment of the present invention.

FIG. 6 is a diagram showing the distribution of the density of photons in the resonator direction in the active layer of the semiconductor optical element according to the third embodiment of the present invention. As shown in FIG. 6, the light density of photons is relatively high in the vicinity of the emission end surface. Then, the density of quantum dots is relatively increased in the vicinity of the emission end surface, as shown in FIG. 7. That is, the density of quantum dots in the resonator direction in a portion of the active layer in which the density of photons is relatively high is increased relative to the density of quantum dots in a portion of the active layer in which the density of photons is relatively low.

Thus, the density of quantum dots capable generating a gain is increased in a portion in which the density of photons is high, thereby limiting the reduction in carrier density caused per one quantum dot in comparison with the conventional art. The local reduction in gain due to hole burning is thereby reduced to improve the emission efficiency of the semiconductor layer.

Fourth Embodiment

A semiconductor optical element according to a fourth embodiment of the present invention is a semiconductor optical amplifier having an active layer including quantum dots, such as that in the first embodiment.

Figure 8:
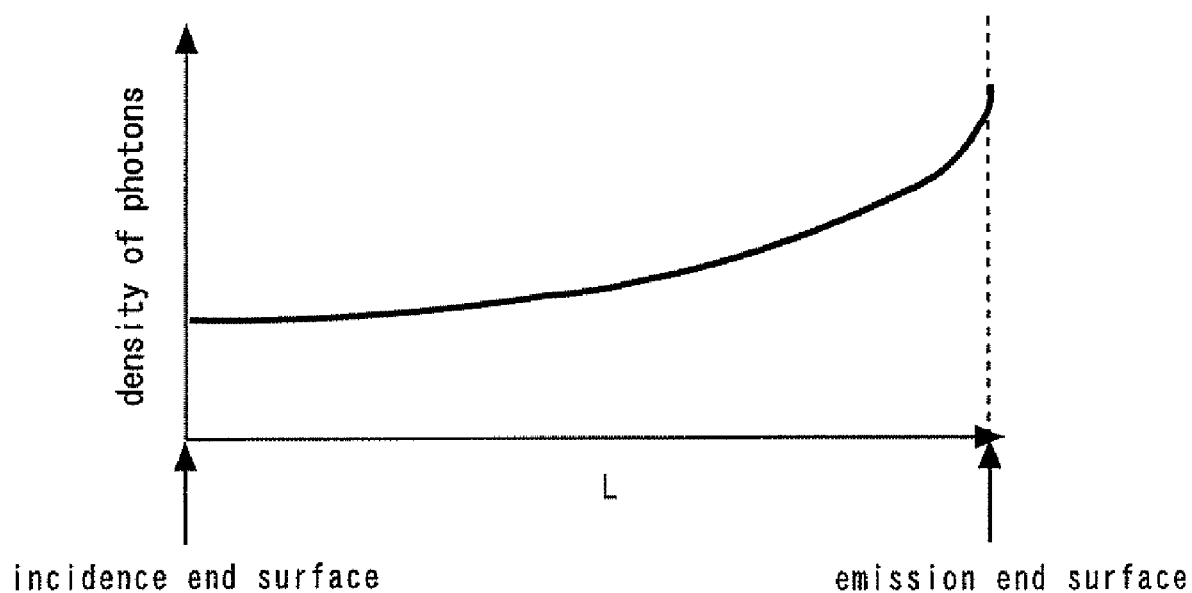
FIG. 8 is a graph showing the distribution of the density of photons in the resonator direction in the active layer of a semiconductor optical element according to a fourth embodiment of the present invention.
Figure 9:
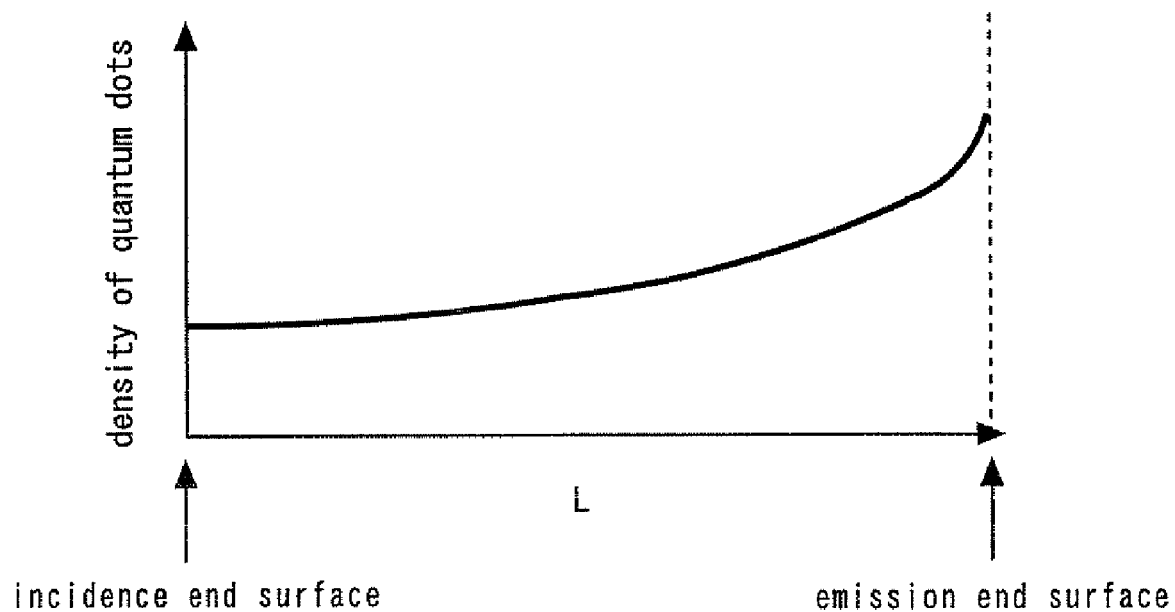
FIG. 9 is a graph showing the distribution of the density of quantum dots in the resonator direction in the active layer of the semiconductor optical element according to the fourth embodiment of the present invention.

FIG. 8 is a diagram showing the distribution of the density of photons in the resonator direction in the active layer of the semiconductor optical element according to the fourth embodiment of the present invention. As shown in FIG. 8, the density of photons is relatively high in the vicinity of the light emission end surface. Then, the density of quantum dots is relatively increased in the vicinity of the emission end surface, as shown in FIG. 9. That is, the density of quantum dots in the resonator direction in a portion of the active layer in which the density of photons is relatively high is increased relative to the density of quantum dots in a portion of the active layer in which the density of photons is relatively low.

Thus, the density of quantum dots capable generating a gain is increased in a portion in which the density of photons is high, thereby limiting the reduction in carrier density caused per one quantum dot in comparison with the conventional art. The local reduction in gain due to hole burning is thereby reduced to improve the light emission efficiency of the semiconductor layer.

Fifth Embodiment

Figure 10:
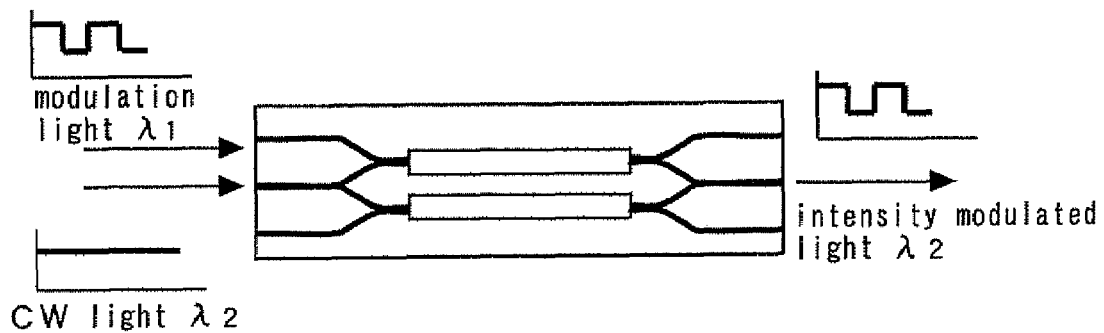
FIG. 10 is a diagram showing a wavelength converter according to a fifth embodiment of the present invention.

FIG. 10 shows a wavelength converter according to a fifth embodiment of the present invention. This wavelength converter is a Mach-Zehnder interferometer incorporating the semiconductor optical amplifier according to the fourth embodiment of the present invention. When modulation light having a wavelength $\lambda 1$ and continuous-wave (CW) light having a wavelength $\lambda 2$ are input to this wavelength converter, the CW light is phase-modulated with the modulation light by the mutual phase modulation effect of the semiconductor optical amplifier to be output as intensity modulated light from the output end of the element. In the case of application of the semiconductor optical amplifier according to the fourth embodiment of the present invention to this kind of wavelength converter, no carrier deficiency occurs in the vicinity of the emission end of the semiconductor optical amplifier and a sufficiently high phase modulation effect is ensured, thus improving the conversion efficiency of the wavelength converter.

Sixth Embodiment

A semiconductor optical element according to a sixth embodiment of the present invention is a waveguide-type light receiving element having an absorption layer including quantum dots.

Figure 11:
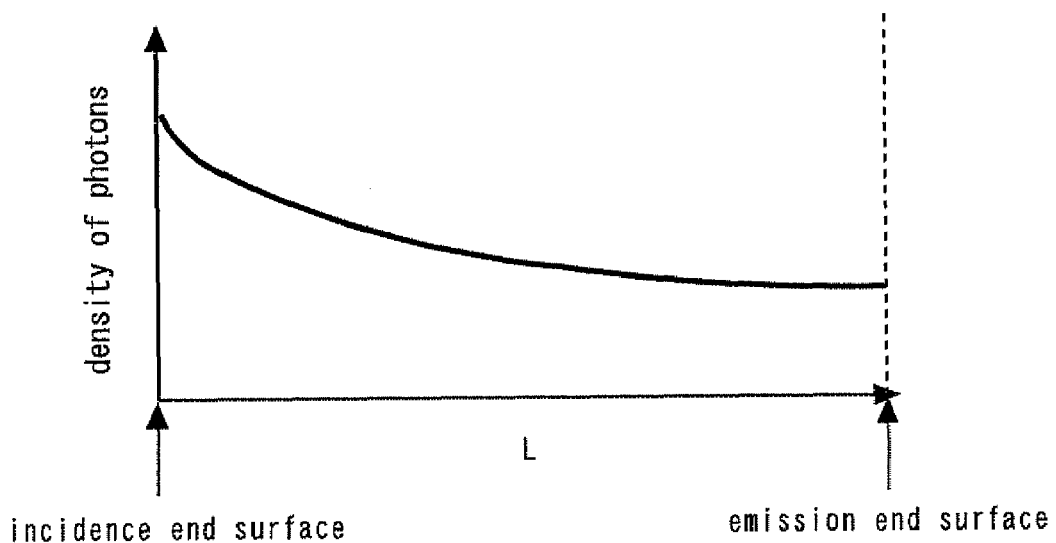
FIG. 11 is a graph showing the distribution of the density of photons in the resonator direction in the absorption layer of a semiconductor optical element according to a sixth embodiment of the present invention.
Figure 12:
FIG. 12 is a graph showing the distribution of the density of quantum dots in the resonator direction in the active layer of the semiconductor optical element according to the sixth embodiment of the present invention.

FIG. 11 is a diagram showing the distribution of the density of photons in the resonator direction in the absorption layer of the semiconductor optical element according to the sixth embodiment of the present invention. As shown in FIG. 11, the density of photons is relatively high in the vicinity of the light incidence end surface. Then, the density of quantum dots is relatively reduced in the vicinity of the incidence end surface having a high light intensity and a high photon density, as shown in FIG. 12.

The absorption coefficient is thereby reduced in the vicinity of the incidence end surface to avoid disturbance of the guide mode of light propagating through the waveguide and to enable light to reach an inner portion of the element. Also, since on the inner side of the element the quantum dot density is high and the light absorption coefficient is increased, the photoelectric conversion efficiency of the light receiving element is improved.

Seventh Embodiment

A method of manufacturing a semiconductor optical element according to a seventh embodiment of the present invention will be described with reference to the drawings. The semiconductor optical element according to the first embodiment can be manufactured by using this manufacturing method.

Figure 13:
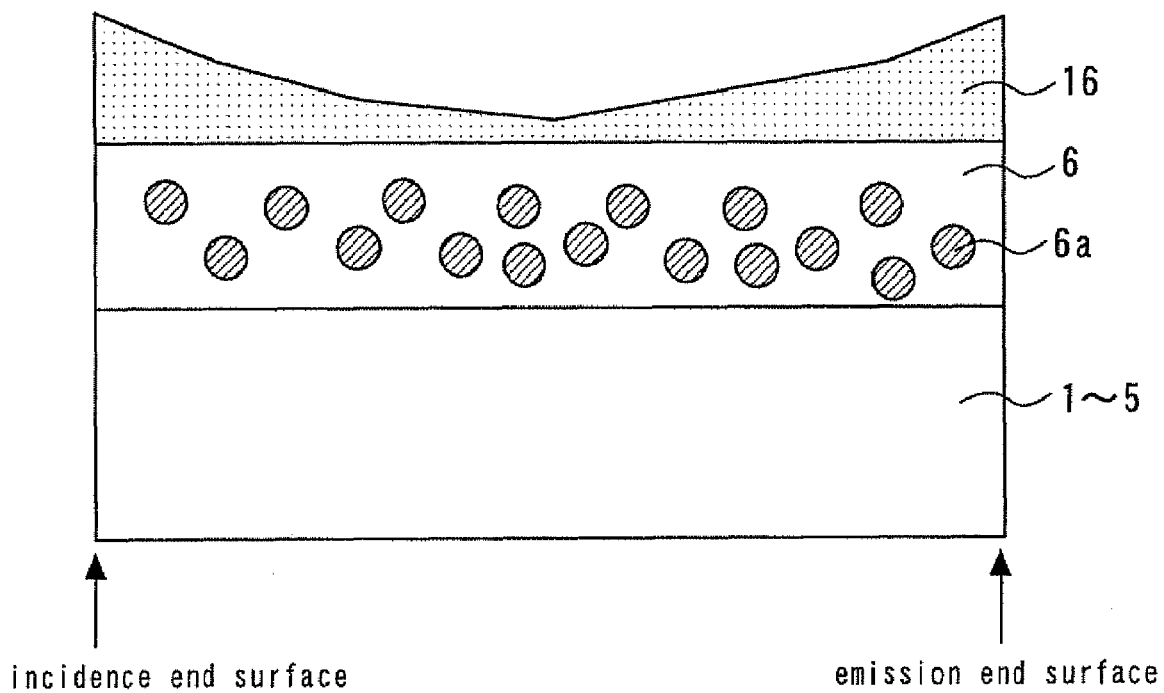
FIG. 13 is a sectional view for explaining a method of manufacturing a semiconductor optical element according to a seventh embodiment of the present invention.

First, as shown in FIG. 13, then-GaAs cladding layer 2, then-AlGaAs diffraction grating 3, the n-GaAs diffraction grating buried layer 4 and the AlGaAs optical confinement layer 5 are formed on the n-GaAs substrate 1. Subsequently, the active layer 6 formed of AlGaAs is formed by using a metal-organic chemical vapor deposition (MOCVD) method or a molecular beam epitaxy (MBE) method. If In is added in this formation, quantum dots 6a formed of InAs are formed in the AlGaAs layer so that the distribution density is generally uniform in the resonator direction.

Subsequently, ZnO film 16 not uniform in film thickness in the resonator direction is formed on the active layer 6 in which quantum dots 6a are uniformly formed. In this embodiment, the film thickness of the ZnO film 16 on a portion of the active layer in which the density of photons is relatively high in the resonator direction is reduced relative to the film thickness of the ZnO film 16 on a portion of the active layer in which the density of photons is relatively low.

Figure 14:
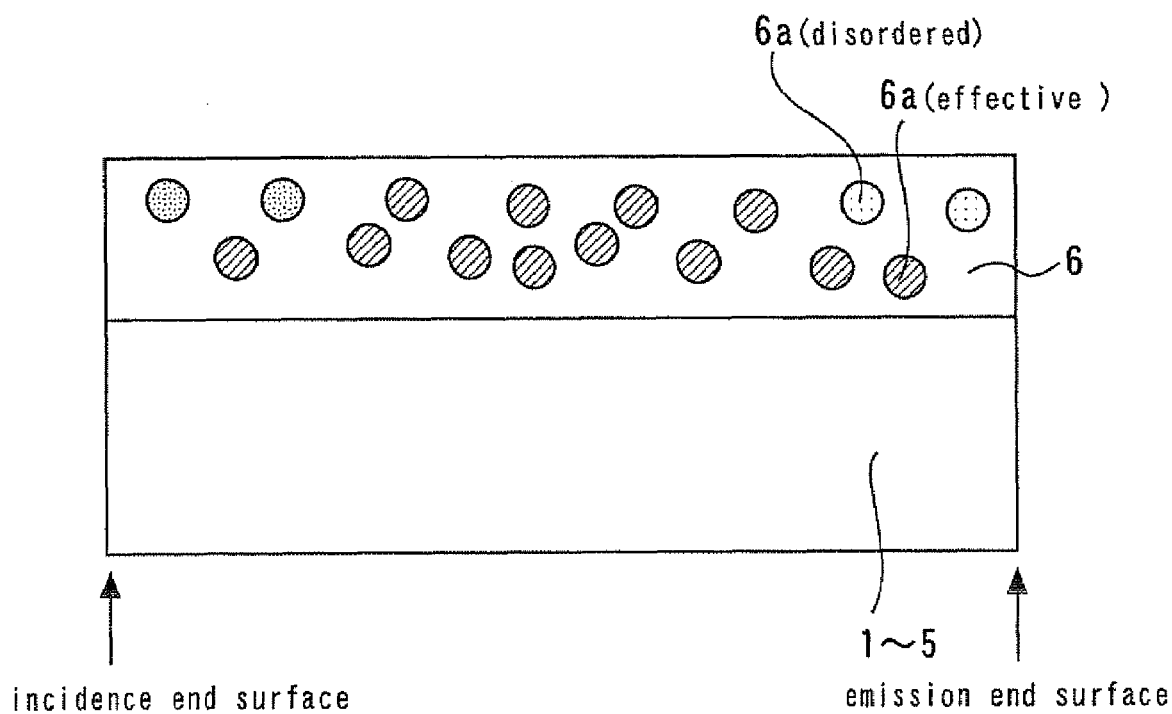
FIG. 14 is another sectional view for explaining a method of manufacturing the semiconductor optical element according to the seventh embodiment of the present invention.

Subsequently, a heat treatment at a high temperature is performed to diffuse Zn from the ZnO film 16 into the active layer 6. Part of the quantum dots 6a are thereby disordered and caused to form a mixed crystal with the active layer 6 to lose the quantum dot 6a function substantially completely. The degree of this change is high in the portion corresponding to the increased film thickness of the ZnO film 16 and having a higher Zn diffusion density. Thus, impurity diffusion not uniform in the resonator direction is performed on the active layer in which quantum dots are uniformly formed to disorder part of the quantum dots and to thereby form a nonuniform density distribution of the quantum dots in the resonator direction in the active layer The ZnO film 16 is thereafter removed, as shown in FIG. 14.

Eighth Embodiment

A method of manufacturing a semiconductor optical element according to an eighth embodiment of the present invention will be described with reference to the drawings. The semiconductor optical element according to the first embodiment can be manufactured by using this manufacturing method.

Figure 15:
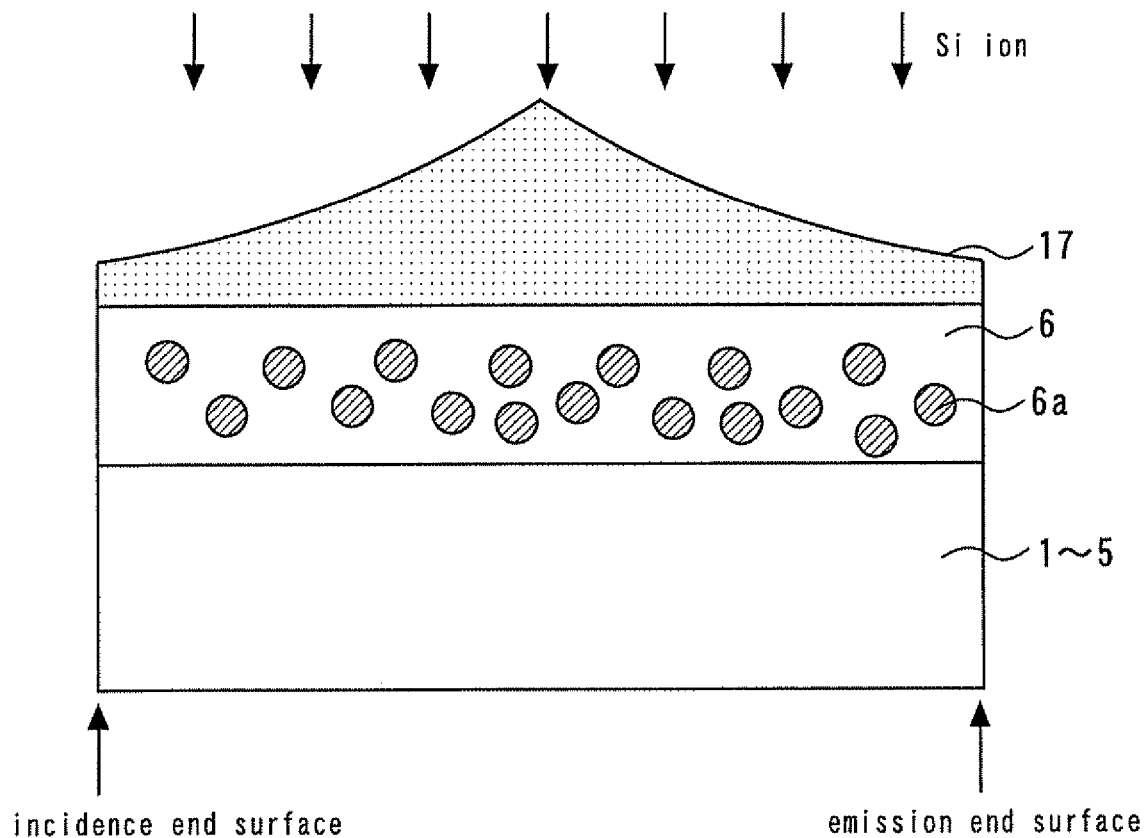
FIG. 15 is a sectional view for explaining a method of manufacturing a semiconductor optical element according to an eighth embodiment of the present invention.

First, as shown in FIG. 15, then-GaAs cladding layer 2, then-AlGaAs diffraction grating 3, the n-GaAs diffraction grating buried layer 4 and the AlGaAs optical confinement layer 5 are formed on the n-GaAs substrate 1. Subsequently, the active layer 6 formed of AlGaAs is formed by using MOCVD or MBE. If In is added in this formation, quantum dots 6a formed of InAs are formed in the AlGaAs layer so that the distribution density is generally uniform in the resonator direction.

Subsequently, a resist 17 not uniform in film thickness in the resonator direction is formed on the active layer 6 in which quantum dots 6a are uniformly formed. In this embodiment, the film thickness of the resist 17 on a portion of the active layer in which the density of photons is relatively high in the resonator direction is increased relative to the film thickness of the resist 17 on a portion of the active layer in which the density of photons is relatively low.

Figure 16:
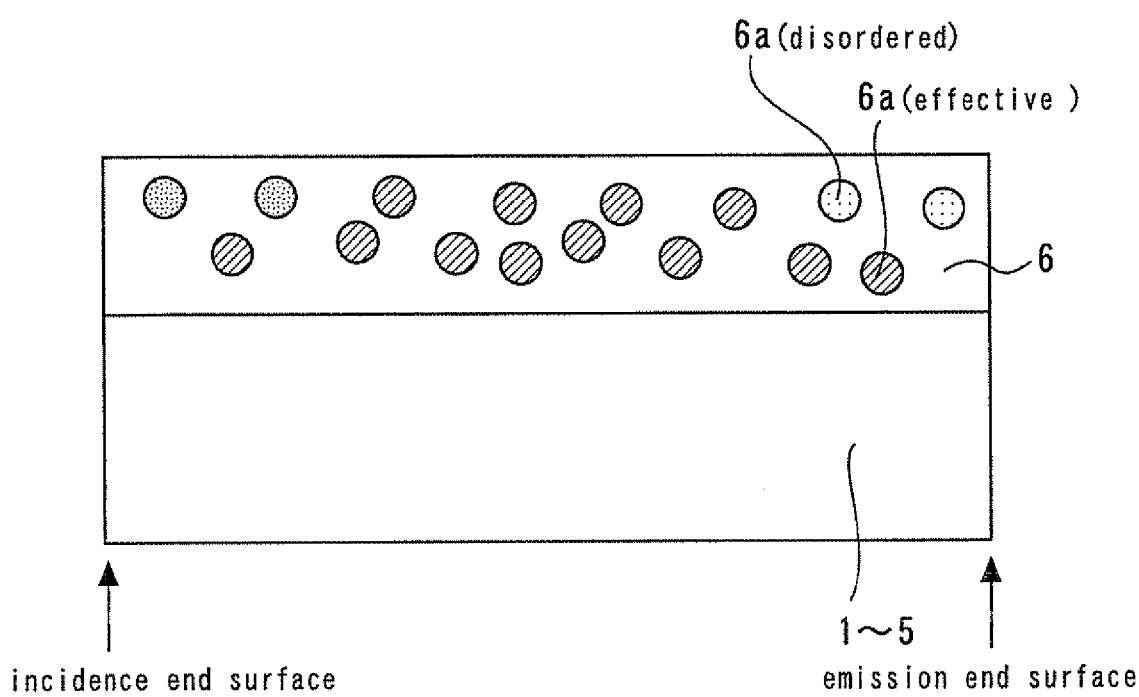
FIG. 16 is another sectional view for explaining a method of manufacturing the semiconductor optical element according to the eighth embodiment of the present invention.
Figure 17:
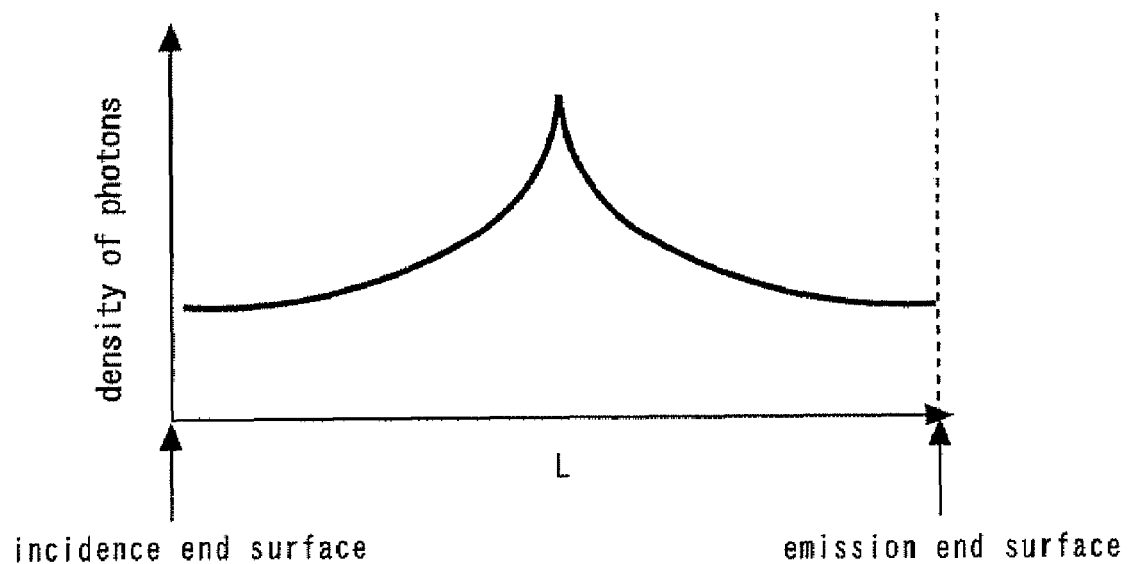
FIG. 17 is a graph showing the distribution of the density of photons in the resonator direction in the active layer of a conventional semiconductor optical element.
Figure 18:
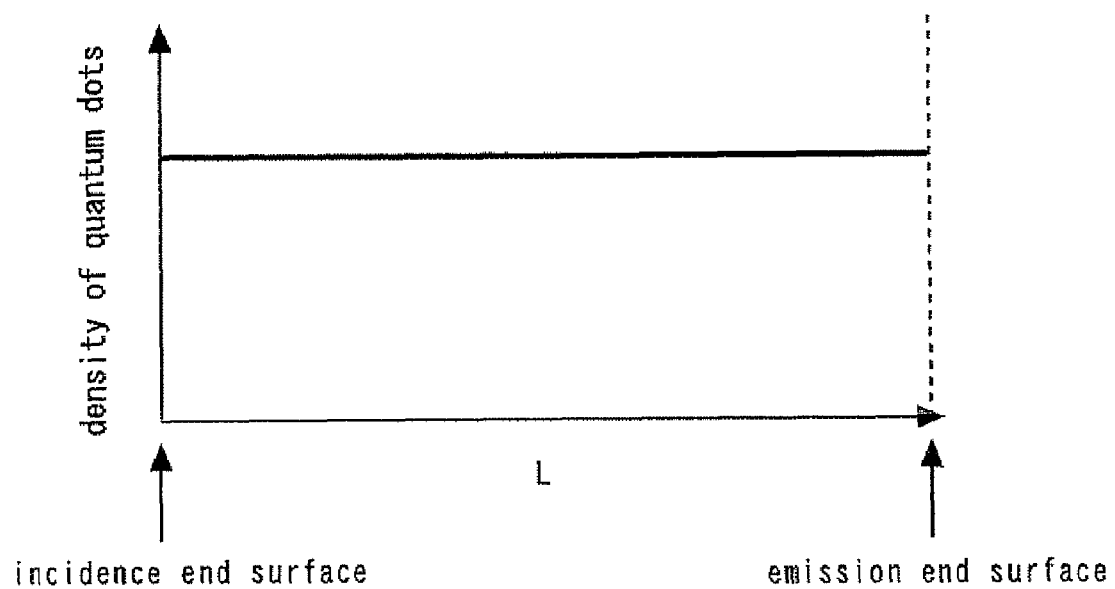
FIG. 18 is a graph showing the distribution of the density of quantum dots in the resonator direction in the active layer of the conventional semiconductor optical element.

Subsequently, Si ions are implanted in the active layer 6 through the resist 17. A heat treatment at a high temperature is thereafter performed to disorder part of the quantum dots 6a and cause the same to form a mixed crystal with the active layer 6 to lose the quantum dot 6a function substantially completely. The degree of this change is high in the portion corresponding to the reduced film thickness of the resist 17 and having a higher implanted Si ion density. Thus, ion implantation not uniform in the resonator direction is performed on the active layer in which quantum dots are uniformly formed to disorder part of the quantum dots and to thereby form a nonuniform density distribution of the quantum dots in the resonator direction in the active layer. The resist 17 is thereafter removed, as shown in FIG. 16.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-276837, filed on Oct. 10, 2006 including specification, claims, drawings and summary, on which the Convention priority of the present application is based, are incorporated herein by reference in its entirety.

What is claimed is:

1. A semiconductor optical element comprising an active layer including quantum dots, wherein density of the quantum dots in a resonator direction in a portion of the active layer in which density of photons is relatively high is higher relative to the density of the quantum dots in a portion of the active layer in which the density of photons is relatively low.

2. The semiconductor optical element according to claim 1, wherein the semiconductor optical element is a distributed feedback semiconductor laser further comprising a diffraction grating in a resonator, and the density of the quantum dots is relatively higher in the vicinity of a phase shift region in the diffraction grating.

* * * * *